United States Patent
Ogata et al.

(10) Patent No.: US 6,627,553 B1
(45) Date of Patent: Sep. 30, 2003

(54) COMPOSITION FOR REMOVING SIDE WALL AND METHOD OF REMOVING SIDE WALL

(75) Inventors: Fujimaro Ogata, Yamaguchi (JP); Tsutomu Sugiyama, Yamaguchi (JP); Kuniaki Miyahara, Yamaguchi (JP)

(73) Assignee: Showa Denko K.K., Tokyo (JP)

(*) Notice: Subject to any disclaimer, the term of this patent is extended or adjusted under 35 U.S.C. 154(b) by 0 days.

(21) Appl. No.: 09/656,020

(22) Filed: Sep. 5, 2000

Related U.S. Application Data
(60) Provisional application No. 60/152,956, filed on Sep. 9, 1999.

(30) Foreign Application Priority Data

Nov. 27, 1998 (JP) .............................. 10-337594
Jul. 6, 1999 (JP) ............................. 11-192290

(51) Int. Cl.$^7$ ............................................ H01L 21/302
(52) U.S. Cl. ................... 438/706; 438/633; 438/692; 438/693; 438/704; 438/745; 438/756; 216/38; 216/103; 216/105
(58) Field of Search .................. 438/706, 633, 438/692, 693, 704, 745, 756; 216/38, 103, 105

(56) References Cited

U.S. PATENT DOCUMENTS

| | | | | |
|---|---|---|---|---|
| 3,901,706 A | * | 8/1975 | Tsuboi et al. ............... 430/205 |
| 3,935,333 A | * | 1/1976 | Muneoka et al. ............... 216/2 |
| 4,556,449 A | * | 12/1985 | Nelson ....................... 216/108 |
| 5,308,745 A | | 5/1994 | Schwartzkopf |
| 5,439,565 A | * | 8/1995 | Torii et al. .................... 205/674 |
| 5,630,904 A | | 5/1997 | Aoyama et al. |
| 5,669,980 A | * | 9/1997 | McNeil et al. ................. 134/3 |
| 5,770,095 A | * | 6/1998 | Sasaki et al. ............... 438/633 |
| 5,795,828 A | * | 8/1998 | Endo et al. ................ 106/1.23 |
| 5,885,476 A | * | 3/1999 | Hong et al. ................. 252/79.2 |
| 5,885,901 A | * | 3/1999 | Gotoh et al. ................ 438/720 |
| 5,972,862 A | * | 10/1999 | Torii et al. .................... 134/1.2 |
| 6,228,179 B1 | * | 5/2001 | Morinaga ....................... 134/2 |

FOREIGN PATENT DOCUMENTS

| | | |
|---|---|---|
| JP | 7-201793 | 8/1995 |
| JP | 7-219240 | 8/1995 |
| JP | 7-249607 | 9/1995 |
| JP | 11-233405 | 8/1999 |

\* cited by examiner

*Primary Examiner*—Matthew Smith
*Assistant Examiner*—V Yevsikov
(74) *Attorney, Agent, or Firm*—Sughrue Mion, PLLC

(57) ABSTRACT

A composition for removing side wall which includes an aqueous solution containing both nitric acid and at least one of carboxylic acids selected from the group consisting of polycarboxylic acid, aminocarboxylic acid, and salts thereof; a method of removing side wall; and a process for producing a semiconductor device. Use of the composition is effective in removing side wall at a low temperature in a short time in semiconductor device production without corroding the wiring material, e.g., an aluminium alloy. Thus, a semiconductor device having an aluminium alloy wiring which has undergone substantially no corrosion can be efficiently produced.

10 Claims, 3 Drawing Sheets

COMPOSITION FOR REMOVING SIDE WALL AND METHOD OF REMOVING SIDE WALL

CROSS-REFERENCE TO RELATED APPLICATION

This application is an application filed under 35 U.S.C. §111(a) claiming benefit pursuant to 35 U.S.C. §119(e)(i) of the filing date of Provisional Application 60/152,956 filed Sep. 9, 1999 pursuant to 35 U.S.C. §111(b).

TECHNICAL FIELD

The present invention relates to a composition for removing side wall and method of removing side wall, more specifically, the present invention relates to a composition for removing side wall, which can remove a side wall deposit (side wall) containing resist polymer and inorganic substances, generated at dry etching using halogen-type gas in the production process of a semiconductor, at a low temperature within a short time while not corroding the wiring material, a method of removing side wall using the composition and a method of producing semiconductor devices comprising the step of removing side wall using the composition.

BACKGROUND ART

A semiconductor device is conventionally produced using a photoresist resin as shown in FIG. 2 (a) to (f), for example, through the following steps (1) to (6):

(1) a metal layer which works out to a wiring material, such as Al, is formed on an insulating layer such as $SiO_2$ on a substrate 1 (FIG. 2 (a));

(2) a positive photoresist 4 is formed on the metal layer 3 (FIG. 2 (b));

(3) a photomask 5 is superposed thereon and the photoresist layer is exposed (FIG. 2 (c));

(4) the photoresist layer is developed to form a resist pattern (FIG. 2 (d));

(5) the exposed metal layer is etched (FIG. 2(e)); and (6) the resist pattern is stripped and removed to obtain a metal wiring pattern (FIG. 2 (f))

To keep up with the tendency in recent years toward higher density of the integrated circuit, formation of a finer pattern is necessary. In the etching step, wet etching by using chemicals has heretofore predetermined, but wet etching is not appropriate for forming a finer pattern because etching direction is not oriented. For forming a finer pattern, dry etching, especially dry etching by using a halogen-type gas such as chlorine gas or $BCl_3$ which is capable of anisotropic etching is taking the place of it.

In the dry etching, film comprising resist polymer and inorganic substances is formed on the side of metal and resist pattern on the metal as shown in FIG. 3 (a). The remained film is called side wall, and the side surface is protected by this side wall therefore, anisotropic etching can be used. The side wall is produced by the chemical reaction of photoresist, wiring material and etching gas at the dry etching. As a result, the side wall assumes a compound having a complicated composition comprising an organic material derived from the photoresist, an inorganic material derived from the wiring material and a halide derived from etching gas.

In the dry etching, in order to completely remove the remained photoresist, an ashing operation (ashing) where the remained photoresist is burned with oxygen plasma after dry etching step, is conducted, but the side wall is not completely removed and a part of it remained (FIG. 3(b)). In the side wall, halogen radical or halogen ion generated at the dry etching with a halogen-type gas is imprisoned and on contacting with water in air, generates an acid. The acid generated corrodes the wiring material (after-corrosion). Because of this, the side wall must be completely removed.

The stripping solution is originally designed to strip the photoresist which is an organic material, therefore, it cannot satisfactorily strip and remove the above-described side wall.

For example, an acidic stripping solution of alkylbenzene-sulufonic acid type cannot satisfactorily remove the side wall even under heating at a high temperature of 100° C. Moreover, the acidic stripping solution has low solubility in water and must be rinsed with a water-soluble organic solvent such as IPA before water rinsing, as a result, the process is complicated.

An alkaline stripping solution of organic amine type also has difficulties in removing the side wall even under heating at a high temperature of 100° C. Furthermore, if the resulting substrate is immediately rinsed with water, the organic amine component and water interact to present strong alkalinity and corrosion of the wiring material is generated. Accordingly, the substrate must be rinsed with IPA or the like in advance of water rinsing, as a result, the process is complicated.

U.S. Pat. No. 5,308,745 (JP-A-6-202345) proposes a stripping composition for highly crosslinked or cured photoresist comprising a stripping solvent such as 2-pyrrolidinone, an amine and a weak acid, and JP-A-7-219240 proposes a positive resist-stripping solution obtained by blending a carboxyl group-containing organic compound with a resist-stripping compositon comprising a nitrogen-containing organic hydroxyl compound. However, as described above, the resist-stripping solution cannot satisfactorily remove the side wall. Furthermore, although an acid such as hydrochloric acid and sulfuric acid, or a base such as aqueous alkylamine and alkanolamine solution may remove the side wall by dissolving the aluminum as a wiring material, they indispensably corrode the wiring material.

Under these circumstances, a stripping solution capable of easily removing a side wall produced by anisotropic dry etching after the formation of photoresist without corroding the wiring material is demanded. The side wall is produced as a result of chemical reaction of photoresist, wiring material and etching gas and assumes a compound having a complicated composition comprising an organic material derived from photoresist, an inorganic material derived from wiring material and a halide derived from etching gas.

DISCLOSURE OF THE INVENTION

The object of the present invention is to provide a composition for removing side wall capable of removing a side wall at low temperature within a short time while not corroding the wiring material, method of removing side wall using the composition and method of producing semiconductors.

As a result of extensive investigations, the present inventors have found that side wall can be removed at low temperature within a short time while not corroding the wiring material by use of a liquid composition comprising nitric acid which by itself corrodes the wiring material, and a polycarboxylic acid, an aminocarboxylic acid or a salt thereof. The present invention has been accomplished based on this finding.

Thus, the present invention relates to a composition for removing side wall, method of removing side wall and method of producing semiconductors as described below.

(1) A composition for removing side wall which comprises an aqueous solution containing nitric acid and at least one kind of carboxylic acids selected from polycarboxylic acid, aminocarboxylic acid and salts thereof.

(2) The composition for removing side wall as described in 1 above, wherein the concentration of said nitric acid is from 0.01 to 50 wt %.

(3) The composition for removing side wall as described in 2 above, wherein the concentration of said nitric acid is from 0.1 to 50 wt %.

(4) The composition for removing side wall as described in 1 above, wherein the concentration of said carboxylic acids is from 0.0001 to 30 wt %.

(5) The composition for removing side wall as described in 4 above, wherein the concentration of said carboxylic acids is from 0.1 to 30 wt %.

(6) The composition for removing side wall as described in 1 above, wherein said polycarboxylic acid or polycarboxylate is an aliphatic polycarboxylic acid or an aliphatic polycarboxylate.

(7) The composition for removing side wall as described in 1 above, wherein said polycarboxylic acid or polycarboxylate is an aromatic polycarboxylic acid or an aromatic polycarboxylate.

(8) The composition for removing side wall as described in 1 above, wherein said aminocarboxylic acid or aminocarboxylate is an aliphatic aminocarboxylic acid or an aliphatic aminocarboxylate.

(9) The composition for removing side wall as described in 1 above, wherein said polycarboxylic acid or polycarboxylate is at least one selected from the group consisting of citric acid, tartaric acid, malic acid, succinic acid, maleic acid, oxalic acid, malonic acid, glutanic acid, adipic acid, D-glucanic acid, itaconic acid, citraconic acid, mesaconic acid, 2-oxoglutaric acid, 3-oxoglutaric acid, acetylenedicarboxylic acid, 1,1-cyclopropanedicarboxylic acid, trimellitic acid, endothal, glutamic acid, methylsuccinic acid, citramalic acid and salts thereof.

(10) The composition for removing side wall as described in 1 above, wherein said aminocarboxylic acid or aminocarboxylate is at least one selected from glycine, alanine, β-alanine, 2-amino-butyric acid, 3-aminobutyric acid, 4-amino-butyric acid, 2-aminocapronic acid, 6-aminocapronic acid, and salts thereof.

(11) The composition for removing side wall as described in any one of 1, 7 or 9 above wherein said polycarboxylic acid is citric acid.

(12) The composition for removing side wall as described in any one of 1, 8 or 10 above wherein said aminocarboxylic acid is glycine.

(13) The composition for removing side wall as described in 1 above, wherein the carboxylic acids are polycarboxylic acid and aminocarboxylic acid.

(14) The composition for removing side wall as described in 13 above, wherein said polycarboxylic acid is citric acid and said aminocarboxylic acid is glycine.

(15) A method of removing side wall comprising cleaning treatment of the side wall generated at the dry etching step in a production process of semiconductors with the composition for removing side wall as described in any one of 1 to 14 above.

(16) The method of removing side wall as described in 15 above, wherein the cleaning treatment is made by dipping.

(17) The method of removing side wall as described in 16 above, wherein the cleaning treatment is operated within a temperature of 0 to 80° C.

(18) The method of removing side wall as described in 17 above, wherein the cleaning treatment is operated within a temperature of 10 to 60° C.

(19) The method of removing side wall as described in 16 above, wherein the cleaning treatment is operated within a period of 1 to 60 minutes.

(20) The method of removing side wall as described in 19 above, wherein the cleaning treatment is operated within a period of 1 to 30 minutes.

(21) A process for producing a semiconductor device comprising a step of the cleaning treatment of the side wall generated at the dry etching step in the production process of the semiconductors using the composition for removing side wall as described in any one of 1 to 14 above.

(22) The process for producing a semiconductor device as described in 21 above, wherein the semiconductor device has Al alloy wiring.

(23) The process for producing a semiconductor device as described in 21 or 22 above, wherein the semiconductor device has Al alloy wiring which is not substantially corroded.

(24) A semiconductor device having substantially uncorroded Al alloy wiring which is obtained by the cleaning treatment of the side wall generated at the dry etching step in the production process of the semiconductor device using the composition for removing side wall as described in any one of 1 to 14 above.

EMBODIMENT OF THE INVENTION

Figure 1:
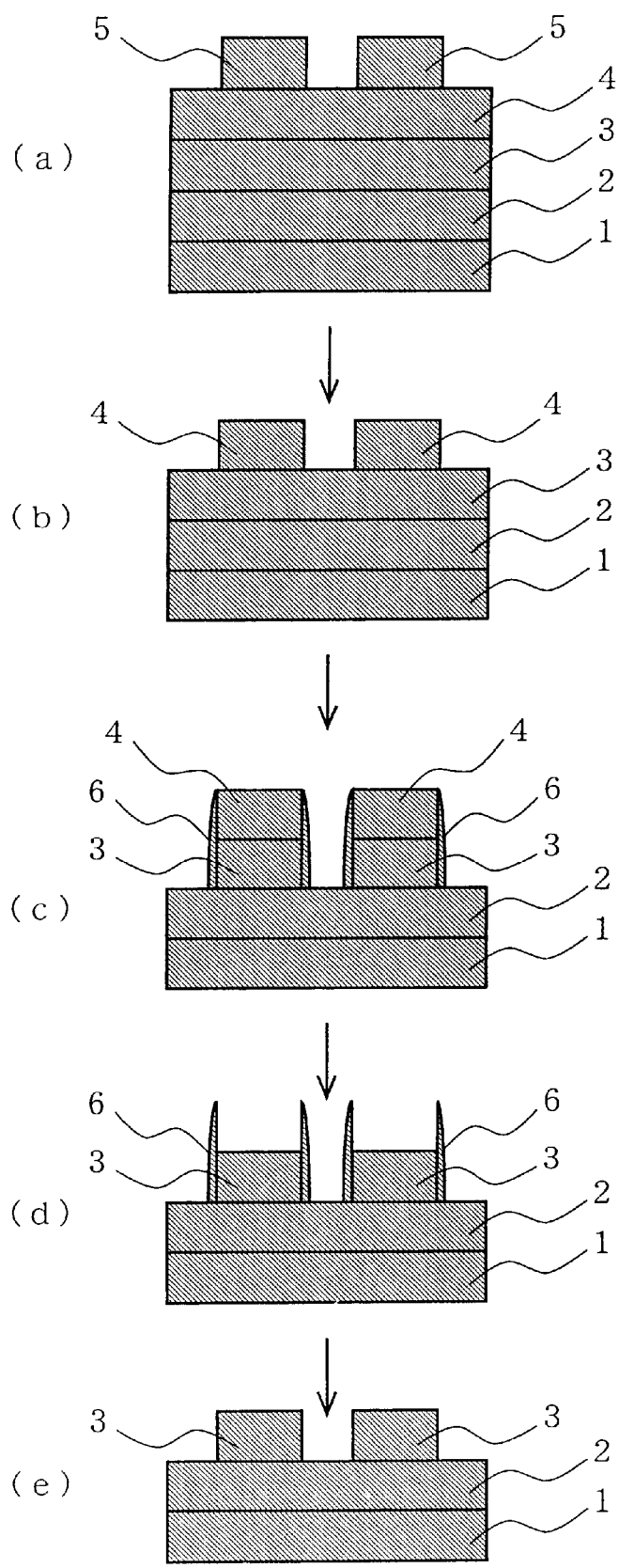
FIG. 1 (a)–(e) is an explanatory view showing the process of producing semiconductor devices by the present invention.
Figure 2:
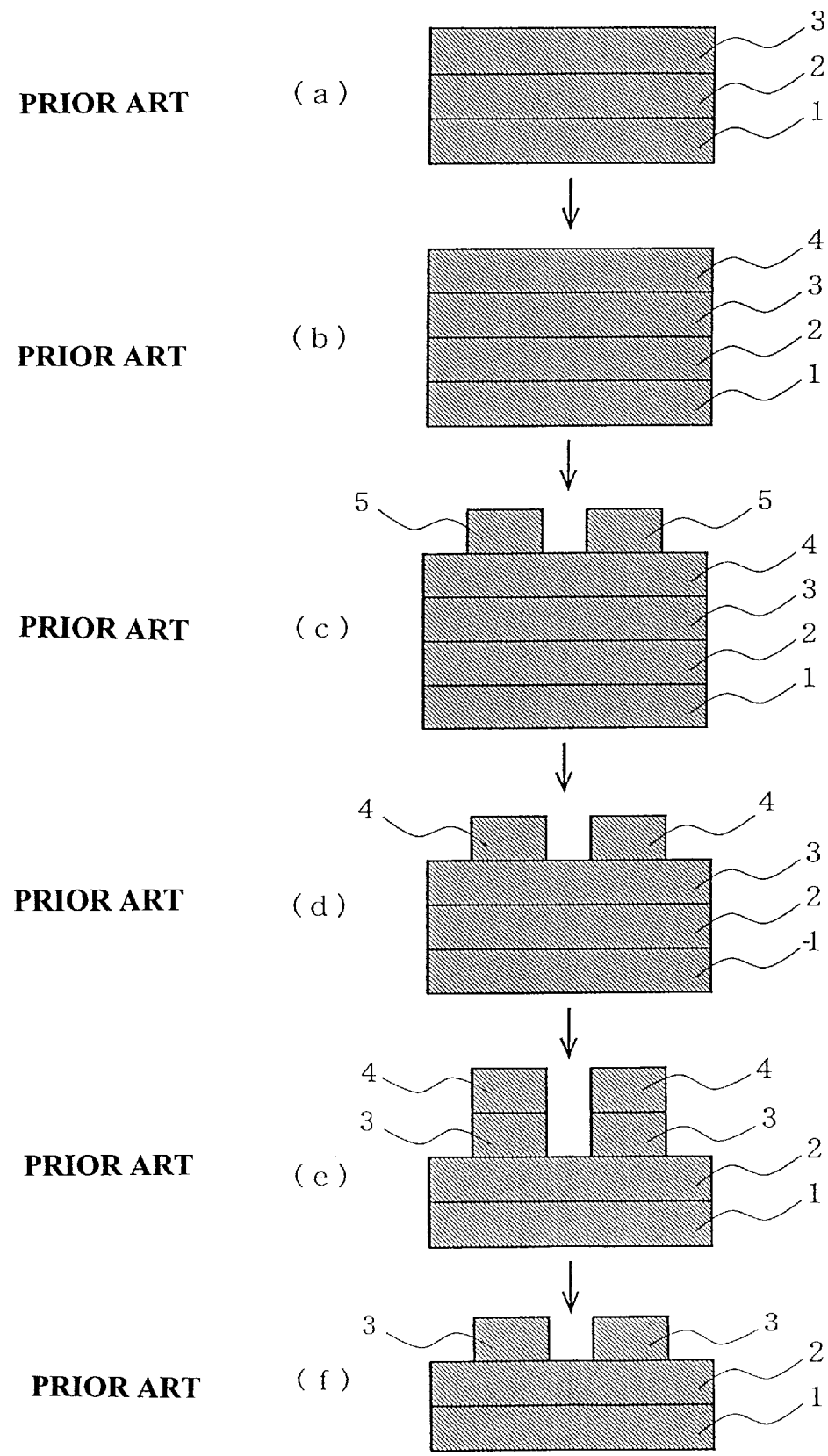
FIG. 2 (a)–(f) is an explanatory view showing the process of producing semiconductor devices using photoresist resin.
Figure 3:
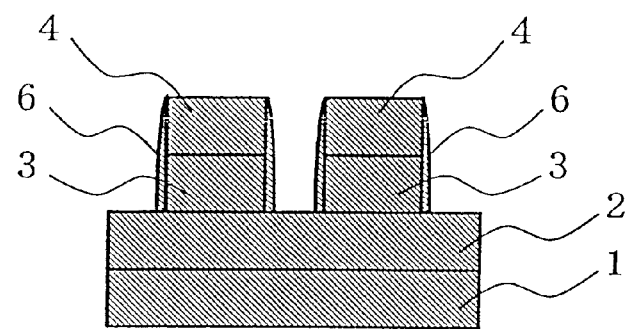
FIG. 3 (a) and (b) is an explanatory view showing the process of dry etching using halogen-type gas and ashing treatment after etching.
Figure 3:
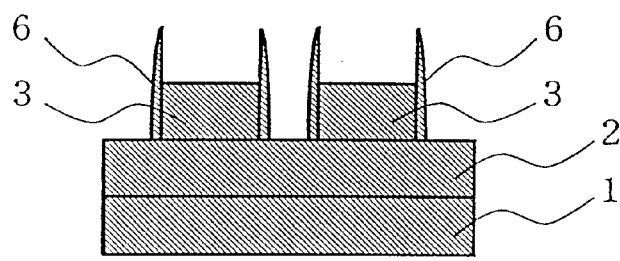

The present invention is described in detail below.

The composition for removing side wall of the present invention is usually provided as an aqueous solution containing nitric acid and at least one of polycarboxylic acid, amino carboxylic acid and salts thereof.

The nitric acid mainly acts as an effective component for removing a side wall. The concentration of nitric acid is preferably from 0.01 to 50 wt % based on the composition as a whole, and more preferably from 0.1 to 50 wt %. If the nitric acid concentration is less than this range, the side wall cannot be removed completely, whereas even if the nitric acid concentration exceeds the range, the effect does not increase any more.

The polycarboxylic acid, an aminocarboxylic acid, or a salt thereof (hereinafter referred to as "carboxylic acids") mainly acts as an effective component for preventing the corrosion of wiring material. The concentration of carboxylic acids is preferably from 0.0001 to 30 wt % based on the composition as a whole, and more preferably from 0.1 to 30 wt %. If the concentration of carboxylic acids is less than this range, the corrosion of wiring material cannot be prevented, whereas even if it exceeds the range, the effect does not increase any more.

Examples of the polycarboxylic acid and polycarboxylate which can be used in the present invention include citric acid, tartaric acid, malic acid, succinic acid, maleic acid, oxalic acid, malonic acid, glutanic acid, adipic acid, D-glucanic acid, itaconic acid, citraconic acid, mesaconic acid, 2-oxoglutaric acid, 3-oxoglutaric acid, acetylenedicarboxylic acid, 1,1-cyclopropanedicarboxylic acid, trimellitic acid, endothal, glutamic acid, methylsuccinic acid, citramalic acid and salts thereof. Citric acid among them is preferably used, however, the present invention is by no means limited thereto. These carboxylic acids may be used either individually or in combination of two or more thereof.

Example of the aminocarboxylic acid and aminocarboxylate which can be used in the present invention include glycine, alanine, β-alanine, 2-aminobutyric acid, 3-aminobutyric acid, 4-aminobutyric acid, 2-aminocaproic acid, 6-aminocaproic acid and salts thereof. Glycine is preferably used, however, the present invention is by no means limited thereto. These aminocarboxylic acids and aminocarboxylates may be used either individually or in combination of two or more thereof.

The composition of the present invention can be added with other components known in the technical field of liquid stripper composition. For example, humectant, surfactant, coloring agent, foam inhibitor etc can be added in a small amount.

Although the mechanism that the composition of the present invention comprising nitric acid and acids described above can remove side wall as well as prevent corrosion of metal wiring is not clear, it is thought that nitric acid and acids dissolve a very slight amount of metal component of the wiring material and strip off the side wall outside the metal, and at the same time a non-conductor film is formed on the metal surface of wiring material by the oxidizing action of nitric acid or an anticorrosive film was formed on the metal surface by the chelating effect of the carboxylic acids.

An example of process for producing semiconductor devices of the present invention containing the step of removing side wall using the composition of the present invention, is explained hereinafter in reference to FIG. 1 (a) to FIG. 1 (e).

FIG. 1 (a) is a view showing the process of forming an insulating layer 2 such as SiO$_2$ on a substrate (for example silicon) 1, forming a metal layer 3 such as Al alloy (Al—Cu, etc.) working out to a wiring material on the insulating layer, forming a positive photoresist layer 4 on the metal layer, superposing a photomask 5 on the photoresist layer, and exposing the photoresist layer. The area exposed to the light becomes soluble in an alkali aqueous solution developer.

FIG. 1 (b) is a view showing the process of developing the photoresist layer to form a resist pattern. The resist in the area exposed to the light is removed.

FIG. 1 (c) is a view showing the process of dry etching the exposed metal layer 3 using halogen-type gas (chlorine-type gas, BCl$_3$ gas, etc.) by an ordinary method. The metal layer 3 in the area where the resist has been removed, is etched and at the same time side wall 6 is formed. The side wall 6 plays a role of protecting the remaining metal layer 3 from excessive etching.

FIG. 1 (d) is a view showing the step of removing the resist pattern 4 by oxygen plasma ashing to obtain a metal wiring pattern 3.

FIG. 1 (e) is a view showing the process of removing the side wall 6 using the composition for removing side wall of the present invention. By using the composition for removing side wall of the present invention, the side wall 6 can be removed at a low temperature within a short time while not corroding the wiring material.

Composition for removing side wall of the present invention can be applied for the resist such as positive resist (novolak-type photoresist) comprising phenol-formaldehyde resin or poly(p-vinylphenol); resist comprising polymethylmethacrylate.

The cleaning treatment by the composition for removing side wall of the present invention, is ordinarily made by dipping method, but other method such as spraying method can be also applied.

The conditions for the cleaning treatment by dipping method vary depending on the concentration of nitric acid and the kind of carboxylic acid to be added and are not limited. But generally the temperature of the cleaning treatment is from 0 to 80° C., preferably from 10 to 60° C. and the time of cleaning treatment is from 1 to 60 minites, preferably from 1 to 30 minites.

Semiconductor device after removing the side wall by the cleaning treatment only needs rinsing with water, and does not need to be treated with any organic solvent such as an alcohol.

BEST MODE FOR CARRYING OUT THE INVENTION

The present invention is described below by referring to Examples and Comparative Examples, however, the present invention should not be construed as being limited thereto.

Examples 1 to 26

On a silicon wafer substrate, SiO$_2$ film was formed and further thereon, Al—Cu layer was formed. On the Al—Cu layer, a novolak type photoresist is coated, exposed and developed to form a resist pattern. Thereafter, the metal layer was dry etched with a chlorine-type gas and the resist except for the side wall was removed by ashing to obtain a test substrate.

The substrate obtained above was dipped in a composition for removing side wall of the present invention having a composition shown in Table 1 and 2, containing nitric acid, an organic acid or an organic acid salt at predetermined temperature and for predetermined time, rinsed with water and dried. Then removability of the side wall and corrosiveness of the wiring material were evaluated according to the criteria specified below, by observing the surface of the treated substrate through SEM(scanning electron microscope). The results obtained are shown in Table 1 and 2.

Removability: o: The side wall was completely removed.
X: The side wall was not removed.
Corrosiveness: o: The wiring material was not corroded.
X: The wiring material was corroded.

TABLE 1

| Example | Nitiric Acid Concentration (wt %) | Organic acid (wt %) | Dipping Time (min) | Dipping Temperature (° C.) | Removability | Corrosiveness |
|---|---|---|---|---|---|---|
| 1 | 1 | citric acid, 0.01 | 20 | 50 | ○ | ○ |
| 2 | 1 | tartaric acid, 0.01 | 20 | 50 | ○ | ○ |
| 3 | 1 | malic acid. 0.01 | 20 | 50 | ○ | ○ |
| 4 | 1 | succinic acid, 0.01 | 20 | 50 | ○ | ○ |
| 5 | 1 | maleic acid, 0.01 | 20 | 50 | ○ | ○ |
| 6 | 1 | oxalic acid, 0.01 | 20 | 50 | ○ | ○ |
| 7 | 30 | citric acid, 3.0 | 20 | 50 | ○ | ○ |
| 8 | 30 | tartaric acid, 3.0 | 20 | 50 | ○ | ○ |
| 9 | 30 | malic acid. 3.0 | 20 | 50 | ○ | ○ |
| 10 | 30 | succinic acid, 3.0 | 20 | 50 | ○ | ○ |
| 11 | 30 | maleic acid, 3.0 | 20 | 50 | ○ | ○ |
| 12 | 30 | oxalic acid, 3.0 | 20 | 50 | ○ | ○ |
| 13 | 1 | ammonium citrate, 0.02 | 20 | 50 | ○ | ○ |
| 14 | 1 | ammonium, malate, 0.02 | 20 | 50 | ○ | ○ |
| 15 | 30 | ammonium citrate, 5.0 | 20 | 50 | ○ | ○ |
| 16 | 30 | ammonium malate, 5.0 | 20 | 50 | ○ | ○ |
| 17 | 1 | glycine, 0.1 | 20 | 50 | ○ | ○ |
| 18 | 1 | alanine, 0.1 | 20 | 50 | ○ | ○ |
| 19 | 1 | 2-aminobutyric acid, 0.1 | 20 | 50 | ○ | ○ |
| 20 | 15 | glycine, 5.0 | 20 | 50 | ○ | ○ |
| 21 | 15 | alanine, 5.0 | 20 | 50 | ○ | ○ |
| 22 | 15 | 2-aminobutyric acid, 5.0 | 20 | 50 | ○ | ○ |
| 23 | 1 | glycine ammonium, 0.2 | 20 | 50 | ○ | ○ |
| 24 | 1 | alanine ammonium, 0.2 | 20 | 50 | ○ | ○ |

TABLE 2

| Example | Nitric Acid Concentration, wt % | Citric Acid Concentration, wt % | Glycine Concentration, wt % | Dipping Time (min) | Dipping Temperature (° C.) | Removability | Corrosiveness |
|---|---|---|---|---|---|---|---|
| 25 | 30 | 1 | 5 | 5 | 50 | ○ | ○ |
| 26 | 30 | 3 | 5 | 5 | 50 | ○ | ○ |

Comparative Examples 1 to 3

The substrate described in the above examples was dipped in an aqueous solution containing nitric acid having concentration shown in Table 3 at predetermined temperature and for predetermined time, rinsed with water and dried. Then removability of the side wall and corrosiveness of the wiring material was evaluated in a condition same as examples, by observing it through SEM(scanning electron microscope). The results obtained are shown in Table 3.

TABLE 3

| Comparative Example | Nitric Acid Concentration, wt % | Concentration of additive, Wt % | Dipping Time (min) | Dipping Temperature (° C.) | Removability | Corrosiveness |
|---|---|---|---|---|---|---|
| 1 | 1 | 0 | 20 | 50 | ○ | X |
| 2 | 15 | 0 | 10 | 50 | ○ | X |
| 3 | 30 | 0 | 5 | 50 | ○ | X |

It is seen from Tables 1 and 2 that by using a composition for removing side wall according to the present invention, which comprises an aqueous solution containing both nitric acid and a polycarboxylic acids, an aminocarboxylic acids and/or a salt thereof (Examples 1 to 26), the side wall can be removed at a low temperature within a short time while not causing corrosion of the wiring material. On the other hand, when an aqueous solution containing only nitric acid was used, the side wall was removed but the wiring material was corroded (Table 3).

Industrial Applicability

By using the composition for removing side wall of the present invention which comprises both nitric acid and at least one kind of carboxylic acids selected from the group consisting of polycarboxylic acid, aminocarboxylic acid and salts thereof, the side wall can be removed at a low temperature within a short time while not causing corrosion of the wiring material.

By using the composition for removing side wall of the present invention, semiconductor device provided with metal wiring such as Al alloy which is not substantially corroded can be obtained.

According to the composition of the present invention, semiconductor device after cleaning treatment can be rinsed with water, and the solvent for rinsing such as alcohol does not need to be used.

The composition of the present invention does not have any adverse effect on human body and environment.

What is claimed is:

1. A composition for removing a sidewall which consists essentially of water, nitric acid and at least one saturated aliphatic polycarboxylic acid or a salt thereof.

2. A composition for removing a sidewall which consists essentially of water, nitric acid and at least one aromatic polycarboxylic acid or salt thereof.

3. A composition for removing a sidewall which consists of water, nitric acid and at least one aliphatic aminocarboxylic acid or a salt thereof.

4. A composition for removing a sidewall which consists essentially of nitric acid and a mixture of polycarboxylic acid and aminocarboxylic acid.

5. The composition for removing a side wall as claimed in claim 4, wherein the polycarboxylic acid is citric acid and the aminocarboxylic acid is glycine.

6. A composition for removing a sidewall which consists of water, nitric acid and at least one saturated aliphatic polycarboxylic acid or a salt thereof.

7. A composition for removing a sidewall which consists of water, nitric acid, surfactant and at least one saturated aliphatic polycarboxylic acid or a salt thereof.

8. A composition for removing a sidewall which consists of water, nitric acid and at least one aromatic polycarboxylic acid or salt thereof.

9. A composition for removing a sidewall which consists of water, nitric acid, surfactant and at least one aromatic polycarboxylic acid or salt thereof.

10. A composition for removing a sidewall which consists of water, nitric acid, surfactant and at least one aliphatic aminocarboxylic acid or a salt thereof.

* * * * *